(12) United States Patent
Kubo

(10) Patent No.: US 6,771,351 B2
(45) Date of Patent: Aug. 3, 2004

(54) PROJECTION EXPOSURE METHOD AND APPARATUS

(75) Inventor: Hiroyoshi Kubo, Tochigi-ken (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/242,692

(22) Filed: Sep. 13, 2002

(65) Prior Publication Data

US 2003/0001114 A1 Jan. 2, 2003

Related U.S. Application Data

(63) Continuation of application No. 09/114,857, filed on Jul. 14, 1998, now Pat. No. 6,476,904.

(30) Foreign Application Priority Data

Jul. 15, 1997 (JP) .............................................. 9-203974

(51) Int. Cl.⁷ ........................ G03B 27/52; G03B 27/42; G03B 27/32
(52) U.S. Cl. .............................. 355/55; 355/53; 355/77
(58) Field of Search .............................. 355/55, 53, 67, 355/50, 77; 356/399, 400, 401; 430/30; 250/548

(56) References Cited

U.S. PATENT DOCUMENTS

| | | | |
|---|---|---|---|
| 4,874,954 A | 10/1989 | Takahashi et al. | 250/548 |
| 5,323,016 A | 6/1994 | Yamada et al. | 250/561 |
| 5,796,467 A | 8/1998 | Suzuki | 355/53 |
| 5,879,845 A | 3/1999 | Takahashi | 430/30 |
| 5,920,398 A | 7/1999 | Iwanaga et al. | 356/401 |
| 6,411,387 B1 * | 6/2002 | Kaneko et al. | 356/401 |

* cited by examiner

Primary Examiner—Peter B. Kim
(74) Attorney, Agent, or Firm—Fitzpatrick, Cella, Harper & Scinto (57) ABSTRACT

An exposure apparatus includes a projection optical system, a first measuring member for measuring a first displacement in a focusing location of a substrate during movement of the substrate, a second measuring member for measuring a second displacement in the focusing location of the substrate after the movement of the substrate, an obtaining member for obtaining an offset value by using measurement values of the first measuring member and the second measuring member, and an adjusting member for adjusting a relative position of another substrate to the projection optical system by using the offset value and a measurement value of the other substrate measured by the first measuring member.

13 Claims, 7 Drawing Sheets

PROJECTION EXPOSURE METHOD AND APPARATUS

This application is a continuation of application Ser. No. 09/114,857, filed on Jul. 14, 1998, now U.S. Pat. No. 6,476,904.

BACKGROUND OF THE INVENTION

1. Field of the Invention

The present invention generally relates to a projection exposure method and apparatus for producing, for example, a semiconductor device or a liquid crystal display device, and, more particularly, to a projection exposure method and apparatus, in which the posture of a substrate, such as a mask or a semiconductor wafer, used for producing a semiconductor device, a liquid crystal display device, or the like, is controlled.

2. Description of the Related Art

Conventionally, in an exposure apparatus of the aforementioned type, a surface of a wafer, coated with a photosensitive material, is brought into alignment with an optimal image-forming plane of a projection optical system by determining the position of the wafer with a sensor, which detects displacement in the focusing direction or tilting of the wafer, and by driving a mechanism, based on the detected displacement or tilting. In this case, determining the focusing direction after positioning an X-Y stage, which drives the wafer in a planar direction significantly reduces productivity. On the other hand, when, in order to increase productivity, the focusing direction is determined before the X-Y stage stops moving, the precision with which the focusing direction is determined is reduced, so that the wafer surface cannot be brought into alignment with, for example, an optimal image forming plane.

SUMMARY OF THE INVENTION

In the conventional projection exposure apparatus described above, productivity is ordinarily increased by determining the vertical (Z) direction before the stage stops vibrating in the focusing direction. The correct vertical direction, however, cannot be accurately determined, as a result of the stage vibration. It is possible to wait for the stage to stop vibrating before determining the vertical direction, but determining the vertical direction in this way takes additional time, since one must wait for the stage to stop vibrating. As a result, productivity is reduced. Accordingly, when steps are taken to measure the wafer location more precisely, more time is required to measure the wafer location, whereas when steps are taken to measure the wafer location in a shorter time, the wafer location is measured less precisely.

Accordingly, in order to overcome the above-described conflicting problems, it is an object of the present invention to provide a method that allows productivity to be increased, without reducing precision and increasing measuring time.

In a first aspect, the present invention provides a projection exposure method that includes steps of moving a substrate, which is placed on a stage that is movable in a direction of an optical axis of a projection optical system and in a direction perpendicular thereto, in the direction perpendicular to the optical axis of the projection optical system in order to successively move a plurality of exposure areas on the substrate to respective, predetermined exposure locations, determining and storing a correction value obtained after moving the exposure areas on the substrate such that the surface of the substrate is aligned with an optimal image forming location, measuring the amount of displacement of each of the exposure areas of the substrate surface from the optimal image forming location of the projection optical system, moving the exposure areas of the substrate surface, based on the measured values, for alignment with the optimal image forming location, correcting the measured displacements based on the determined correction value, and exposing the substrate surface.

The step of measuring the amount of displacement of the exposure areas from the optical image forming location and the step of moving the exposure areas of the substrate surface to the optimal image forming location can be at least partly performed concurrently with a step of moving the substrate in the direction perpendicular to the optical axis of the projection optical system.

The method can further include setting a timing of starting the step of measuring the amount of displacement of the exposure areas with reference to the amount of time that has elapsed since the stage has started moving in the direction perpendicular to the optical axis of the projection optical system.

The step of measuring the amount of displacement of the exposure areas can be started when the amount of displacement from a target location becomes at most a predetermined value during movement of the stage in the direction perpendicular to the optical axis of the projection optical system.

In another aspect, the present invention provides a projection exposure apparatus that includes a projection optical system for projecting a pattern formed on a base onto a photosensitive substrate, a stage, movable in a direction of an optical axis of said projection optical system and in a direction perpendicular thereto, for holding the photosensitive substrate, a sensor for measuring displacement in a focusing location, which occurs when the surface of the photosensitive substrate on the stage is displaced from a predetermined location in the optical axis direction of the projection optical system, means for adjusting the location of said stage in the optical axis direction of said projection optical system in order to align the photosensitive substrate on said stage with the predetermined location in the optical axis direction of said projection optical system, based on the measured value obtained by said sensor, means for generating a relationship between the location of said stage in the direction perpendicular to the optical axis of said projection optical system and a correction value indicating the displacement in the focusing location obtained after said adjustment means adjusts the location of said stage, and for storing the generated relationship, determining means for determining the amount of displacement in the focusing location of the photosensitive substrate based on the displacement in the focusing location measured by said sensor, after the photosensitive substrate is moved, during exposure, to a predetermined location in a plane extending in the direction perpendicular to the optical axis of said projection optical system, means for correcting the determined amount of displacement, based on the correction value stored in said storing means, and means for moving said stage in the optical axis direction of said projection optical system in order to align the photosensitive substrate with the predetermined location, based on the correction made by said correction means.

The apparatus can further comprise means for causing a correction value, obtained by a subsequent measurement, and a location from the stage, obtained when the initial correction value is equal to the correction value obtained by the subsequent measurement to be stored in the storing means, wherein the initial measurement is performed, after the photosensitive substrate is moved to the predetermined location on the plane extending perpendicular to the optical axis of the projection optical system, to measure the amount of displacement in the focusing location of the photosensitive substrate using the sensor, in order to move the photosensitive substrate vertically to the predetermined location, based on the initial measurement, and wherein the subsequent measurement is performed, using the sensor to measure the amount of displacement in the focusing location of the photosensitive substrate, which amount of displacement measured in the subsequent measurement is the correction value.

The initial measurement can be started, along with movement of the stage, either after a certain amount of time has elapsed from a time when the photosensitive substrate has started moving to the predetermined location on the plane extending perpendicular to the optical axis of the projection optical system or when the displacement from the predetermined target location becomes at most a predetermined value.

The initial measurement for generating data to be stored in the storing means can be performed without exposing the photosensitive substrate during the data measurements, and the photosensitive substrate can thereafter be exposed during subsequent measurements.

The correction value can indicate the displacement in the focusing location in the direction of the optical axis of the projection optical system and in a direction of axial rotation perpendicular to the direction of the optical axis of the projection optical system.

The predetermined location in the optical axis direction of the projection optical system can correspond to one of an optimal image forming plane of the projection optical system and an image forming plane of an alignment measuring system used for bringing the photosensitive substrate within a certain target plane.

The determining means can determined the amount of displacement in the focusing location of a substrate other than the photosensitive substrate used for exposure.

The apparatus can further comprise means for positioning the photosensitive substrate, being moved in the optical axis direction of the projection optical system, to a location spaced by a certain amount from the optimal forming plane.

The means for moving the stage in the optical axis direction of the projection optical system is capable of returning the photosensitive substrate, being tilted, to a predetermined orientation.

The correcting means can comprise a control section which uses one of a correcting method corresponding to the size and type of a pattern formed on the base and data stored in the storing means.

The control section can comprise numerical value processing means for performing weighting of the correction value and the position of the stage previously stored in the storing means, and for deleting any data values falling outside one of a predetermined movement average and a predetermined permissible range.

The control section sets intervals between subsequent measurements based on an allowable amount of displacement in the focusing location, an exposure amount and a processing time of the photosensitive substrate, with the allowable amount of displacement, exposure amount and processing time depending on the pattern to be formed.

In yet another aspect, the present invention provides a semiconductor device produced using either the projection exposure method of the present invention or the projection exposure apparatus of the present invention.

DESCRIPTION OF THE PREFERRED EMBODIMENTS

A description will now be given of preferred embodiments of the present invention.

Figure 1:
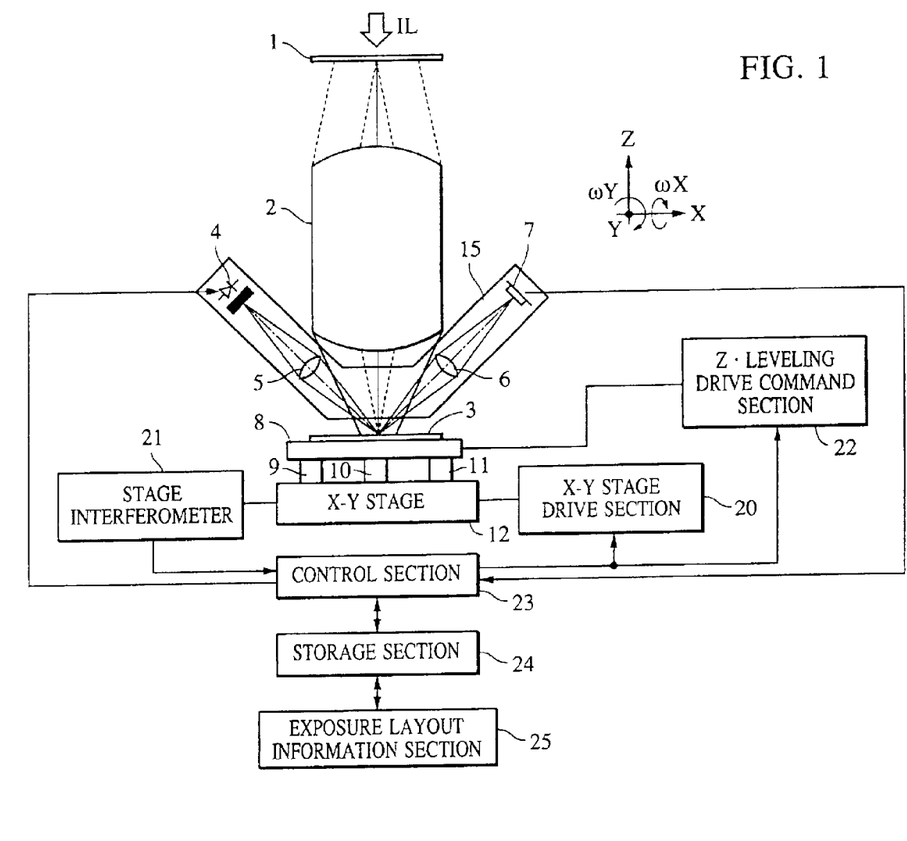
FIG. 1 is a schematic view of the construction of a projection exposure apparatus with stages used for making adjustments when there is displacement in the focusing direction or tilting, by the measuring method in accordance with the present invention.

In FIG. 1, the projection exposure apparatus of the present invention comprises a projection optical system 2 for projecting a mask pattern onto one of a plurality of shots on a wafer 3, being a photosensitive substrate; a Z stage 8 capable of moving in an optical axis direction of the projection optical system 2, while carrying the wafer 3; an X-Y stage 12 movable in a direction perpendicular to the optical axis; leveling stages 9, 10, and 11, which can move the Z stage 8 in tilting directions, ωX and ωY, of the wafer 3; and a sensor 15 for detecting displacement in the focusing position and/or tilting of the surface of the wafer 3, in order to assist in bringing the wafer 3 into alignment with an optimal image forming plane of the projection optical system 2.

In the projection exposure apparatus of the present invention, the wafer 3 is moved along an X-Y plane, in a direction perpendicular to the optical axis of the projection optical system 2, to a predetermined location. Before the wafer 3, being moved, reaches the predetermined location, a first measurement is made, using the sensor 15, to determine whether there is any displacement in the focusing position of the wafer 3. Based on the first measurement, if displacement exists, the wafer 3 is moved in the Z direction to the predetermined location. When the wafer 3 is being exposed, a second measurement is performed, using the sensor 15, in order to determine once again whether any displacement exists in the focusing position and/or whether any tilting of the wafer 3 has arisen. Then, any amount of displacement in focusing position and any amount of tilting, as well as the positions of the stages, are stored.

Then, another wafer 3 is conveyed into the projection exposure apparatus. The first measurement is similarly performed on this wafer 3 to determine the amount of displacement in the focusing location. Then, a value, obtained by performing the second measurement, can be added to or subtracted from the value obtained, based on a certain relationship by performing the first measurement. A means for moving the wafer 3 in the Z direction is used to bring the wafer surface into alignment with, for example, an ideal image forming plane.

In the present invention, any displacement in the focusing location and any tilting of the surface of a wafer on the stage are previously stored, so that measurements thereof can be started without delay at an optimal timing. Therefore, the substrate surface can be precisely brought into alignment with the image forming plane of the projection optical system, without reducing the precision of the measurements and increasing the time required for positioning the substrate surface.

FIG. 1 is a view showing the construction of a step-and-repeat type projection exposure apparatus to which a control device is applied, in an embodiment of the present invention. A reticle 1, having a circuit pattern formed thereon, is uniformly illuminated with exposure light IL. When the exposure light, which has illuminated the pattern, passes through a projecting lens of the projection optical system 2, the pattern of the reticle 1 is projected onto a wafer 3 used for producing a semiconductor device. The wafer 3 is placed on the Z stage 8, which is capable of moving in the direction of the optical axis of the projection optical system 2 in order to drive the wafer 3 in the Z direction. The Z stage 8 is driven by the driving systems 9, 10, and 11 in the leveling ($\omega$X and $\omega$Y) directions. Driving in the Z leveling direction is performed in response to a drive amount command generated from a Z leveling drive command section 22. The Z stage 8 and the driving systems 9, 10, and 11 are provided on the X-Y stage 12, which moves two-dimensionally, in parallel, within a horizontal plane. The X-Y stage 12 is driven by an X-Y stage drive section 20, including a motor or the like, with the coordinates of the location thereof being successively measured by a stage interferometer 21.

Based on the coordinates determined by the stage interferometer 21, a control section 23 outputs a predetermined drive command to the X-Y stage drive section 20, and positions the X-Y stage 12 (and thus, the wafer 3) at the desired location in the X-Y coordinate system.

The sensor 15, which may be a grating incidence type, is provided for bringing into alignment the image forming plane of the projection optical system 2 and the surface of a local shot on the wafer 3. The sensor 15 primarily comprises a light source 4, a projection objective lens 5, a light-receiving objective lens 6, upon which light reflected from the surface of the wafer 3 impinges, and a light-receiving section (charge coupled device (CCD)) 7. Based on the measured value obtained by means of the sensor 15, the control section 23 computes any displacement in focusing location or tilting of the local shot surface of the wafer 3 in order to output a predetermined command to the Z leveling drive command section 22.

Figure 5:
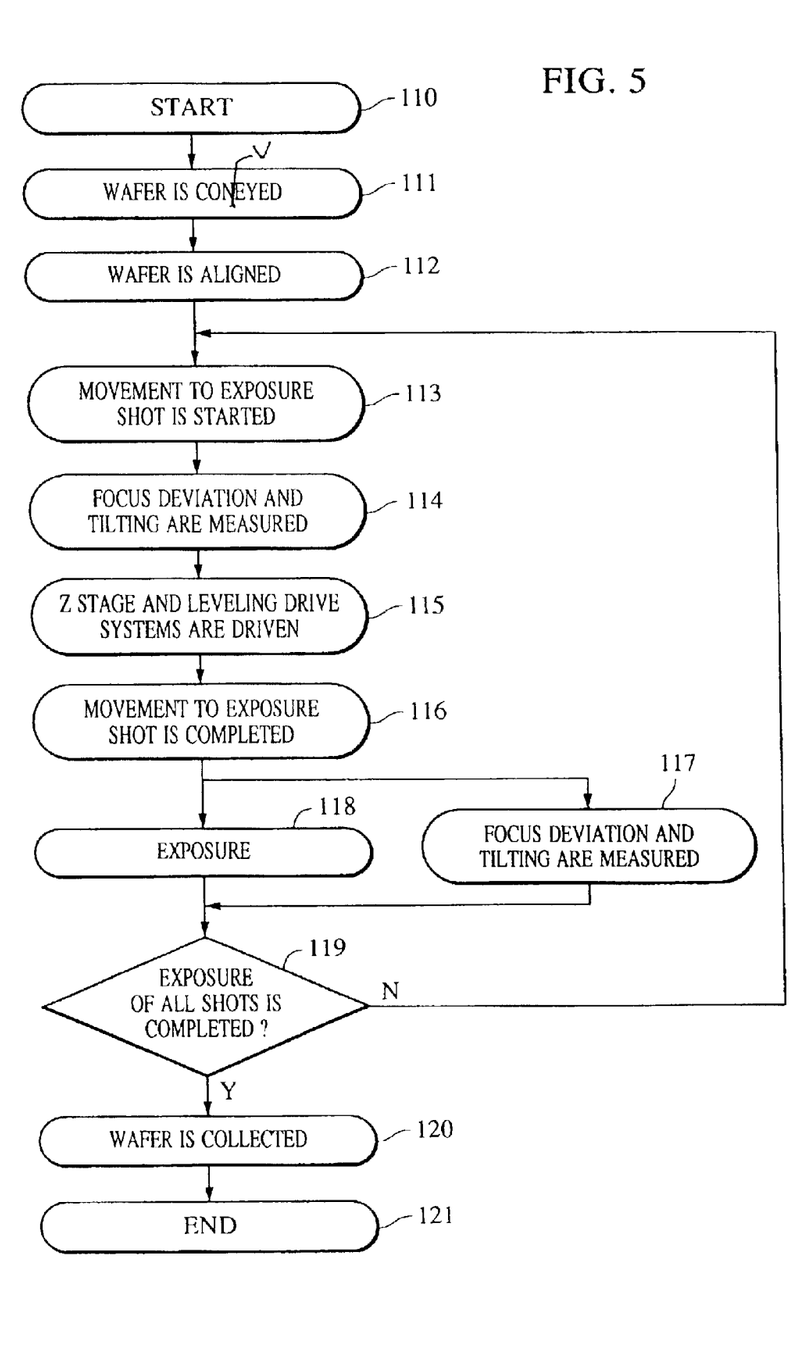
FIG. 5 is a schematic view showing a flowchart of the operation of a projection exposure apparatus with stages used for making adjustments when there is displacement in the focusing direction or tilting of a wafer, by the measuring method in accordance with the present invention.

FIG. 5 is a flow chart of the operation of the projection exposure apparatus with steps in accordance with the present invention. Starting from Step 110, the operation proceeds to Step 111 in which a wafer 3 is conveyed onto the Z stage 8. Then, in Step 112, the wafer 3 is subjected to alignment. In Step 113, movement is made to a shot on the wafer 3 to be exposed. After passage of time, t, from the X-Y stage driving starting time, the sensor 15 is used, in Step 114, to measure any displacement in focusing location and/or tilting of the wafer 3. In Step 115, based on the measured value in Step 114, the Z stage 8 and the leveling drive systems 9, 10, and 11 are driven in order to correct the displacement in the focusing location and the tilting of the wafer 3, and positioning of the wafer 3, including that in the X-Y direction, is completed in Step 116. Thereafter, in Step 118, the wafer shot is exposed.

In this embodiment, in Step 117, any displacement in focusing location and tilting of the wafer 3 are measured, during exposure of the wafer 3. Essentially, if, in Step 115, the Z leveling stage is correctly driven to correct the displacement in the focusing location or any tilting measured in Step 114 while the X-Y stage is being driven, and a measurement is made in Step 117 for any displacement in focusing location or tilting during the exposure of the wafer 3, there should be no displacement in the focusing location or tilting. In Step 114, however, measurements are often made while the X-Y stage is vibrating in the Z or leveling directions. Therefore, in these instances, an offset $\beta$ will be included in the measurement. Conventionally, the wafer 3 was moved, based on the measurement including the offset, so that the wafer 3 was not positioned at an optical exposure location of the projection lens of the projection optical system 2. In this embodiment, however, such an offset value $\beta$ is stored in a storage section 24 shown in FIG. 1.

As mentioned above, when the next wafer 3 is being exposed, any displacement in focusing location or tilting of the wafer 3 is measured (Step 114). The measured value is expressed as $\gamma$. Then, the offset value $\beta$ is subtracted from the measured value $\gamma$. The obtained value is expressed as $\epsilon$, which is sent to the Z leveling drive command section 22 in order to drive the Z stage 8 and the leveling drive systems 9, 10, and 11 (Step 115). This causes the wafer 3 to be moved to the optimal exposure location of the projection optical system 2, without lengthening the duration of movement of the stage. When exposure (Step 118) and measurement of focus deviation and tilting (Step 117) are completed, a confirmation is made as to whether the exposure of all shots is completed (Step 119), and if not, movement is made to another shot to be exposed (Step 113), and if it is completed, the wafer is collected (Step 120), and the procedure ends (Step 121).

Figure 2:
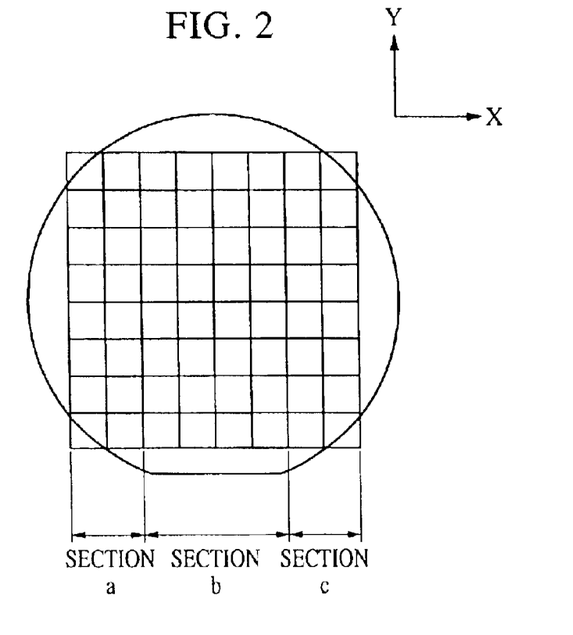
FIG. 2 is a schematic view of a wafer shot layout.
Figure 3:
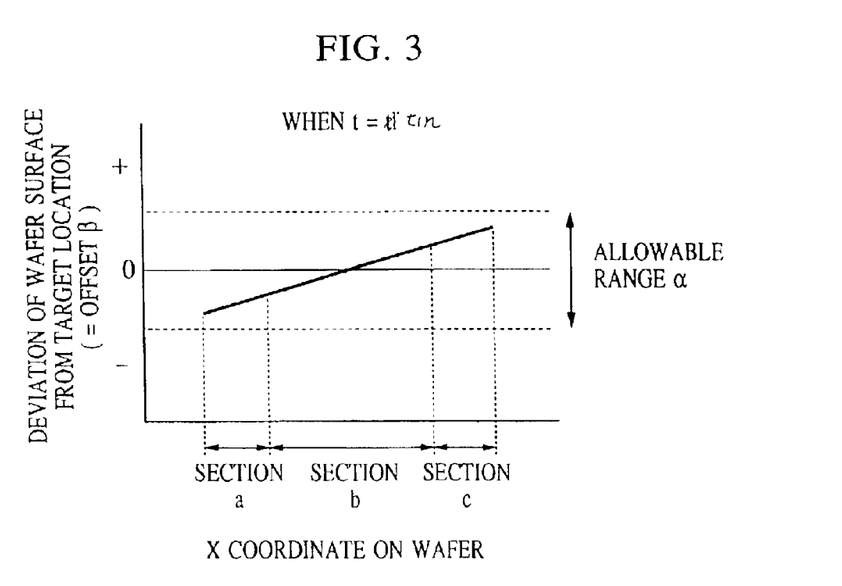
FIG. 3 is a schematic view showing a graph of the displacement of portions of the wafer surface in the z direction from the target locations, when the starting time t of measuring the displacement in the focusing direction or tilting is equal to tm.

A description will now be given in detail of the operation of the storage section 24 used for making offset value $\beta$ corrections. FIG. 2 is a view showing a layout of 64 shots on the wafer. FIG. 3 is a graph showing the offset values. In this graph, the offset value $\beta$ corresponds to the extent to which each wafer shot surface is displaced from the image forming plane of the projection lens of the projection optical system 2, after displacement in the focusing location and tilting of the wafer 3 have been corrected. In this case, the starting time t for correcting the displacement in the focusing location or tilting of the wafer 3 for every shot is set at tm (sec). The displacements from the target locations of the shots with identical X coordinates of FIG. 2 are shown.

Figure 4:
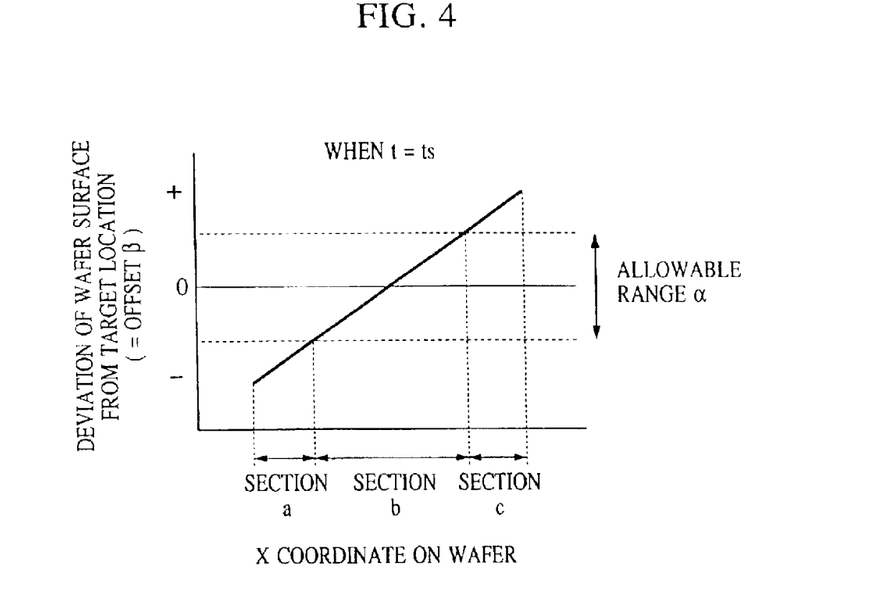
FIG. 4 is a schematic view showing a graph of the displacement of portions of the wafer surface in the z direction from the target locations, when the starting time t of measuring the displacement in the focusing direction or tilting is equal to ts.

FIG. 4 is another graph showing the extent to which each wafer shot surface is displaced from the projection lens image forming plane, when the aforementioned measurement starting time t for every shot is set at ts (sec) (ts<tm). In FIG. 3, the offset values β are all within the allowable range α, whereas in FIG. 4, the offset values β for sections a and c within the wafer area fall outside the allowable range α.

In FIG. 3, the offset values β are within the allowable range α, but the measurement starting time is delayed, as compared to the measurement starting time with respect to FIG. 4. When the measurement is started earlier to increase productivity, the offset values β fall outside the allowable range a, as shown in FIG. 4. Therefore, in the present invention, the offset values β are stored in accordance with the X coordinate of each section of the wafer, so that even when the measurement starting time is set at ts (sec), the offset values for sections a and c fall within the allowable range α. Thereafter, for another similar wafer, displacement in the focusing location and tilting are corrected to obtain a measured value γ. When the measured value γ is corrected after subtracting the offset value β from it, the displacements in the focusing locations of all of the wafer shots with respect to their target locations will be zero. As a result, compared to the values in FIG. 3, displacements from the target locations will be reduced, with the productivity kept high.

Obviously, higher productivity can be achieved by correcting only the measured values γ for sections a and c, whose offset values β fall outside the allowable range a, using the offset values β. Nevertheless, the depth of the projection lens of the projection optical system 2 varies with the circuit pattern of the reticle 1. The projection exposure apparatus of the present invention is capable of changing the aforementioned allowable range in correspondence with the required depth, in accordance with information regarding, among other factors, an exposure layout provided by exposure layout information section 25.

In the present embodiment, the wafer was described using only the X coordinate, but, as shown in FIG. 2, an actual wafer is described using X-Y coordinates. Therefore, the offset values β are stored in a matrix arrangement in correspondence with the circuit pattern of the reticle 1 so as to optimize productivity.

Offset values β result from deformation of the body of the projection exposure apparatus caused by movement of the stage, or from vertical movement of the stage occurring when its speed increases or decreases. Therefore, if the graphs are straight lines, as shown in FIGS. 3 and 4, an approximation expression in which the stage coordinates are variables may be used. In the present embodiment, corrections generally are not made on the first wafer. Therefore, depending on the circumstances, a dummy wafer may be used instead of the first wafer actually to be produced. The projection exposure apparatus of the present invention is, however, capable of determining and storing the correction value β for each shot, without initially exposing the first wafer, and then exposing the shots while making corrections using the correction value β for each shot.

Although, in the present embodiment, the approximation expression is a linear expression, the approximation expression may be an N order expression. In addition, even when the approximation expression becomes a non-linear expression so that the offset value β becomes large at a particular location, the approximation expression can be partly corrected by storing the coordinates and the offset value β for the particular location.

In the present embodiment, correction of displacements in the focusing locations and tilting is performed just before exposure of the substrate. However, this correction may be performed at times other than just before exposure of the substrate, in order to align the wafer. In that case, the wafer shot may be slightly displaced from an ideal image forming plane by a predetermined amount. The shifting amount only needs to be added to the correction value β. In this case, the correction value β, obtained during exposure of the wafer, may be used as the approximation expression, without directly measuring the displacement in the focusing location and tilting to obtain the correction value β during alignment measurements. The correction value β for the alignment measurements, then, may be obtained by the approximation expression from the correction value β for exposure of the wafer.

Although, in the present embodiment, a photosensitive substrate was used, other substrates may also be used. For example, a plate, placed on a stage, may be used to measure the amount of offset of a base line used for alignment.

Figure 6:
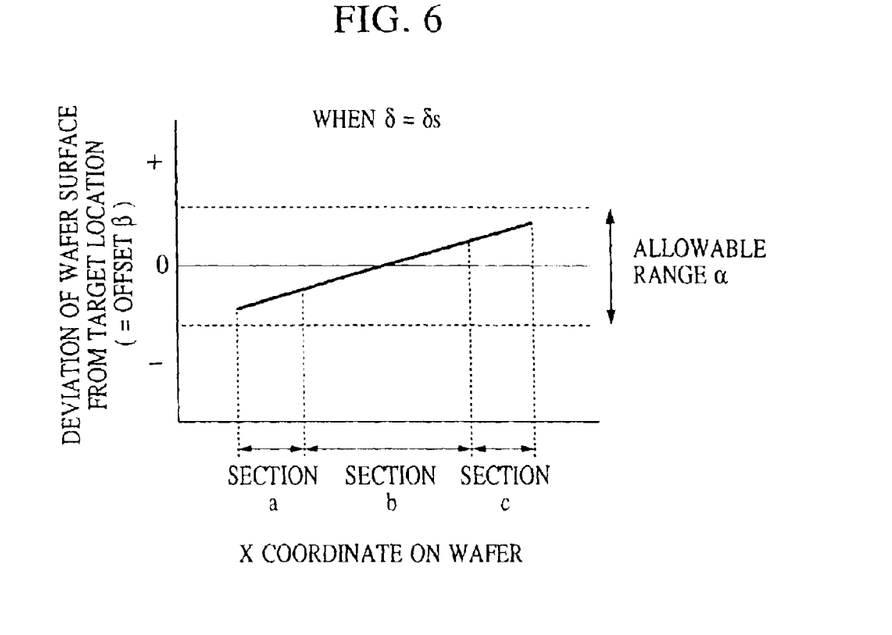
FIG. 6 is a schematic view showing a graph of the displacement of portions of the wafer surface in the z direction from the target locations, in a case in which measurement of the displacement in the focusing direction or tilting is started when a difference δ from the target location of the X-Y stage becomes equal to δs.
Figure 7:
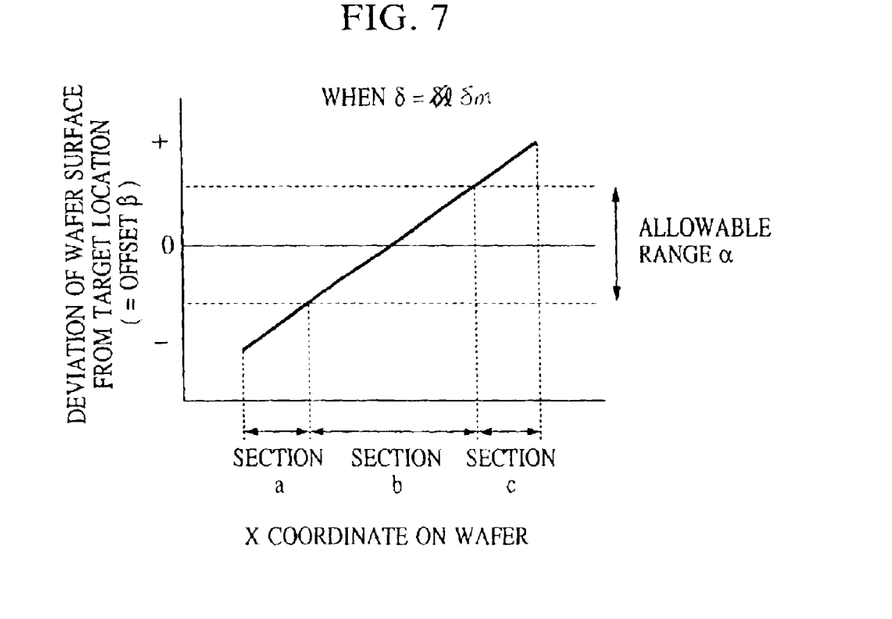
FIG. 7 is a schematic view showing a graph of the displacement of portions of the wafer surface from the target locations, in a case in which measurement of the displacement in the focusing direction or tilting is started when the difference δ from the target location of the X-Y stage becomes equal to δm.

A description will now be given of a second embodiment of the present invention. In the first embodiment, the measurement of any displacement in the focusing location and tilting is started a predetermined time ts (sec) after movement of the stage. In the second embodiment, the measurement of any displacement in the focusing location and tilting is started when a difference between a value measured by the stage interferometer 21, which measures the location of the X-Y stage 12, and a certain target value becomes equal to or less than δ (nm). In this case, the offset characteristic curves previously shown in FIGS. 3 and 4 become the curves as shown in FIGS. 6 and 7, respectively. When one waits for a sufficient time until the difference δ for every shot is reduced to a small value δs, the offset values β fall within the allowable range, as shown in FIG. 6. However, this causes the starting time of measuring any displacement in the focusing location and tilting to be delayed, as a result of which, productivity is reduced. When the productivity is important, the difference δ is set to be δm (μm) (δm>δs), so that displacements of the shots of the wafer surface from the target locations for sections a and c fall outside the allowable range α. Therefore, as in the first embodiment, the offset values β are stored in correspondence with the X coordinates of all of the sections of the wafer, so that the offset values β for sections a and c fall within the allowable range. The difference δ from the target value in the X-Y direction is set based on the precision required and the circuit pattern to be produced.

When the offset value β, which has been measured once, is used for a long period of time, matching conditions between the measuring system and the driving system may change over time, so that the offset value β may change. Therefore, any displacement in the focusing location or tilting is measured for every wafer during exposure thereof in order to obtain an offset value β for each wafer. The measured and stored offset values β are stored in correspondence with the circuit pattern. If there are large variations in the values, obtained by one measurement, the measured results for several wafers are pooled to obtain movement averages or other statistical data. These operations are checked during exposure of the wafers, so that productivity is not reduced. The extent to which the matching conditions change over time is always checked, so that when it becomes greater or less than a certain value, a warning is given. The aforementioned functions allow the apparatus to be always kept in a stable state.

A description will now be given of an embodiment of a device production method in which the projection exposure apparatus or method of the present invention is used.

Figure 8:
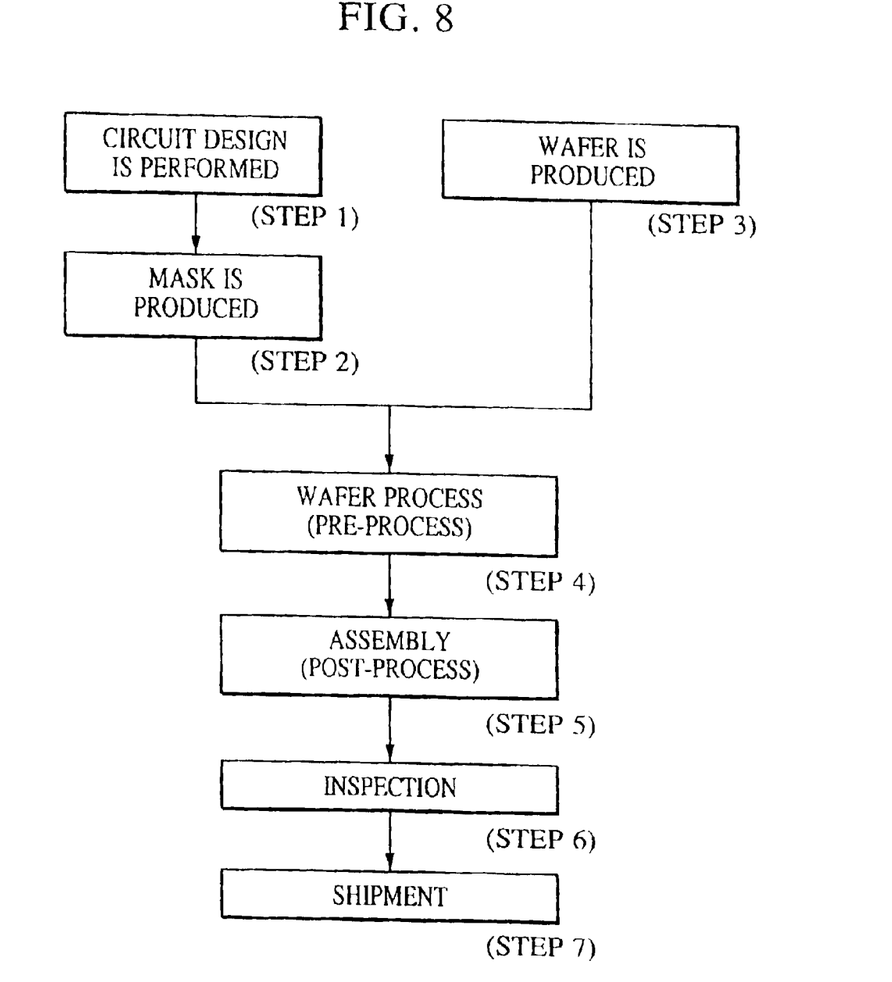
FIG. 8 is a flowchart of the production steps of manufacturing a micro device.

FIG. 8 is a flowchart showing the production steps of a micro device, such as a semiconductor chip (including, for example, an IC or an LSI), a liquid crystal panel, a charge-coupled device (CCD), a thin-film magnetic head, or a micromachine. In Step 1, the pattern of the device is designed. Then, in Step 2, a mask circuit pattern is produced. In Step 3, a wafer is produced using silicon, glass, or other such material. In Step 4 (a wafer process step or a pre-processing step), the prepared mask circuit pattern and the wafer are used to form the actual circuit onto the wafer using lithography techniques. Then, in the following step, Step 5 (an assembly step or a post-processing step), the wafer with the circuit formed thereon is formed into a semiconductor chip, wherein assembly (dicing, bonding), packaging (of the chip), and the like are performed. In Step 6, the semiconductor device prepared in Step 5 is inspected by conducting operation confirmation and durability tests. Thereafter, in Step 7, the semiconductor device is shipped.

Figure 9:
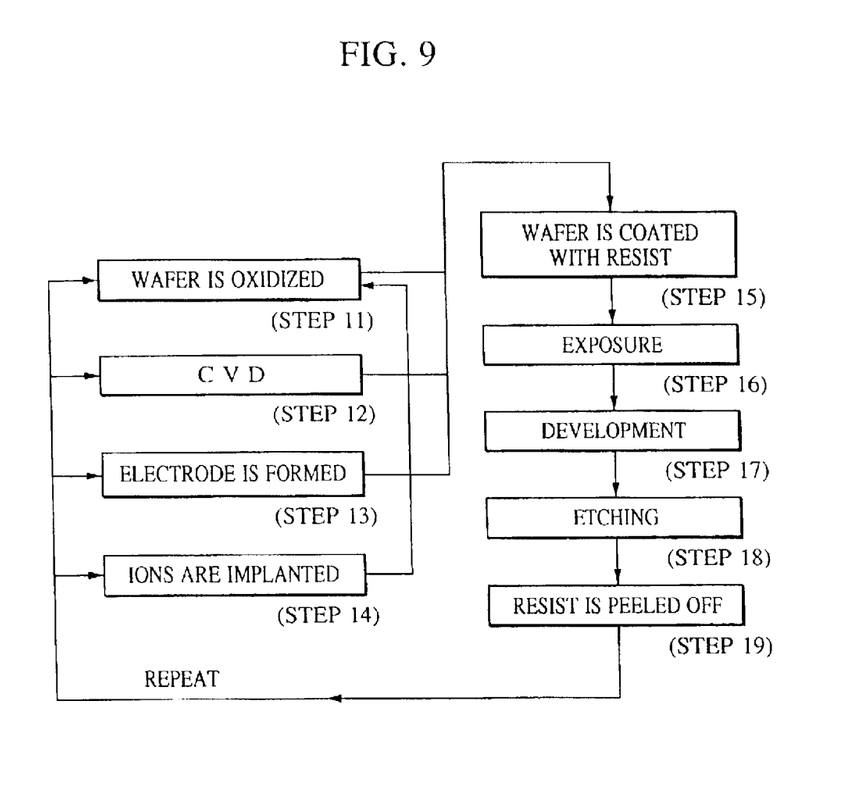
FIG. 9 is a flowchart illustrating the wafer process of FIG. 8 in more detail.

FIG. 9 is a flowchart showing the above-described wafer process in more detail. In Step 11, the surface of the wafer is oxidized. Then, in Step 12 (chemical-vapor deposition (CVD) step), an insulation film is formed on the wafer surface. In Step 13, an electrode is formed on the wafer by evaporation. In Step 14, ions are implanted into the wafer. In Step 15, a photosensitization agent is applied onto the wafer. In Step 16, the mask circuit pattern is printed onto the wafer by exposure using the exposure device provided with alignment elements. In Step 17, the exposed wafer is developed. In Step 18, portions other than where the developed resist image is formed are etched. In Step 19, any unnecessary resist is removed from the wafer, after the etching is performed. Multiple circuit patterns are formed on the wafer by repeating the above-described steps.

According to the production method in the present embodiment, it is possible to produce a highly integrated semiconductor device at a low cost.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretations so as to encompass all such modifications and equivalent structures and functions.

What is claimed is:

1. An exposure apparatus, comprising:

a projection system;

a measuring system which measures a first position of a first substrate in a focusing direction of said projection system during movement of the first substrate to a target location and measures a second position of the first substrate, being at the target location, in the focusing direction;

an obtaining system which obtains an offset value based on the first and second positions; and an adjusting system which adjusts a position of a second substrate in the focusing direction based on the offset value and a position of the second substrate in the focusing direction obtained by said measuring system during movement of the second substrate.

2. An apparatus according to claim 1, wherein the movement includes movement in a direction perpendicular to the focusing direction.

3. An apparatus according to claim 1, wherein the first substrate is a dummy substrate.

4. An apparatus according to claim 1, wherein said measuring system measures the first position after an amount of time has elapsed from a time when the movement of the first substrate has started.

5. An apparatus according to claim 1, wherein said measuring system measures the first position after a difference between a location of the first substrate and the target location becomes equal to or less than a predetermined value.

6. An apparatus according to claim 1, wherein said measuring system measures a tilting amount of the substrate.

7. An apparatus according to claim 1, wherein said measuring system measures the second position during exposure of the substrate to a pattern.

8. An apparatus according to claim 1, wherein the first substrate is different from the second substrate.

9. An apparatus according to claim 1, wherein said second position measuring step is performed during said projecting step.

10. An apparatus according to claim 1, wherein the first substrate is the same as the second substrate.

11. A device production method, comprising:

projecting a pattern by a projection system;

measuring a first position of a first substrate in a focusing direction of the projection system during movement of the first substrate to a target location;

measuring a second position of the first substrate, being at the target location, in the focusing direction;

obtaining an offset value based on the first and second positions;

measuring a third position of a second substrate in the focusing direction during movement of the second substrate; and adjusting a position of the second substrate in the focusing direction based on the third position and the offset value.

12. An apparatus according to claim 11, wherein the first substrate is different from the second substrate.

13. A method according to claim 11, wherein the first substrate is the same as the second substrate.

* * * * *